United States Patent [19]

Kologe et al.

[11] Patent Number: 5,431,959
[45] Date of Patent: Jul. 11, 1995

[54] PROCESS FOR THE ACTIVATION OF NICKEL - PHOSPHOROUS SURFACES

[75] Inventors: Donna Kologe, Thomaston; Cynthia Retallick; Jon Bengston, both of West Hartford, all of Conn.

[73] Assignee: MacDermid, Incorporated, Waterbury, Conn.

[21] Appl. No.: 296,697

[22] Filed: Aug. 26, 1994

[51] Int. Cl.⁶ .............................................. B05D 3/10
[52] U.S. Cl. .................................. 427/304; 427/305; 427/437; 427/443.1
[58] Field of Search ............ 427/304, 305, 437, 443.1, 427/438

[56] References Cited

U.S. PATENT DOCUMENTS

| | | | |
|---|---|---|---|
| 4,160,049 | 7/1979 | Narcus | 427/443.1 |
| 4,181,760 | 1/1980 | Feldstein | 427/305 |
| 4,636,255 | 1/1987 | Tsuda et al. | 427/443.1 |
| 5,091,225 | 2/1992 | Goto | 427/430.1 |

*Primary Examiner*—Benjamin L. Utech
*Attorney, Agent, or Firm*—John L. Cordani

[57] ABSTRACT

Disclosed is a composition and process useful in activating nickel-phosphorous surfaces for subsequent plating thereon. A combination of sulfuric acid and ammonium sulfate is utilized to render otherwise non-catalytic nickel-phosphorous surfaces catalytic to subsequent plating.

16 Claims, No Drawings

PROCESS FOR THE ACTIVATION OF NICKEL - PHOSPHOROUS SURFACES

FIELD OF INVENTION

The present invention relates to a composition and process useful in activating nickel-phosphorous surfaces for subsequent plating thereon. The subsequent plating may consist of electroless or electrolytic gold, palladium, cobalt, copper or nickel. A combination of sulfuric acid and ammonium sulfate is utilized to render otherwise non-catalytic nickel-phosphorous surfaces catalytic to subsequent plating.

BACKGROUND OF INVENTION

Electroless deposits of nickel-phosphorous are well-known and widely utilized in various industries as functional coating over a variety of substrates. Solutions used to produce these deposits are versatile and well-known. In many cases, however, it is useful to deposit other types of metals over nickel-phosphorous surfaces in order to obtain certain desirable properties such as corrosion resistance, contact reliability, improved conductance, or solderability. In attempting to accomplish this, artisans have found that nickel-phosphorous surfaces, particularly those with relatively high proportions of phosphorous, are not catalytic for initiation of many conventional electroless plating baths including, without limitation, electroless copper/formaldehyde, electroless gold, electroless palladium, electroless cobalt, and in some cases, other electroless nickel-phosphorous baths.

It is well documented in the art, that nickel-phosphorous surfaces can be non-catalytic to the initiation of various subsequent electroless plating solutions. In the prior art, various procedures have been utilized to render such non-catalytic surfaces catalytic. Typical procedures known for activation of non catalytic nickel-phosphorous surfaces include activation with precious metal catalysts, such as palladium, zincating, impressing of favorable galvanic potentials and others. U.S. Pat. No. 4,181,760 (Feldstein), incorporated herein in its entirety by reference, teaches the activation of non-catalytic nickel-phosphorous surfaces with an electroless nickel-boron pre-plate. It is also well documented, however, that such prior art activation procedures are tedious and costly. The present invention addresses the needs of the art and overcomes many of the shortcomings of the prior teachings.

SUMMARY OF THE INVENTION

It is a principal object of the present invention to provide an effective and economical process for rendering nickel-phosphorous alloy surfaces catalytic to subsequent plating, particularly electroless plating. The process comprises contacting the otherwise non-catalytic nickel-phosphorous surface with a solution comprising sulfuric acid and ammonium sulfate, and thereby, rendering the surface catalytic to subsequent electroless plating.

Other objectives of the present invention, if not specifically set forth herein, will be apparent to one skilled in the art from a reading and understanding of the following detailed description of the present invention.

DETAILED DESCRIPTION OF THE INVENTION

The present invention provides an easy, economical and efficient method for rendering nickel-phosphorous surfaces catalytic to subsequent electroless plating. The invention comprises contacting a non-catalytic nickel-phosphorous surface with a solution comprising a mixture of sulfuric acid and ammonium sulfate, thereby rendering the surface catalytic to subsequent electroless plating. Thus, in this one simple step, nickel-phosphorous surfaces are activated to accept subsequent electroless plating. The activation of the nickel can be achieved by the method of the present invention, even after the surface has aged for long periods of time (months).

The invention is useful in any application which requires a surface of nickel-phosphorous to be overcoated with another metal, particularly if that metal is to be deposited by electroless means. Many applications require this type of treatment. One such application, which is particularly important is in the production of printed circuit boards. Printed circuit boards have various tabs, connectors, and other areas of electrical connection which are initially formed of copper. The performance of these areas is enhanced by plating a precious metal over-coating. However, in order to minimize the thickness of the precious metal coating, thereby saving cost, and in order to provide maximum performance, a layer of nickel-phosphorous is interposed between the copper and the precious metal. Thus, the copper surface is first plated, usually electrolessly, with nickel-phosphorous. Then it is desired to over-coat the nickel-phosphorous with a precious metal. However, a problem arises since the nickel-phosphorous surface may not be catalytic to the precious metal plating bath (usually electroless) and thus plating of the precious metal will not initiate on the nickel-phosphorous surface.

As discussed above, the prior art has proposed several solutions to this problem. Some examples have included activating surfaces with palladium catalysts or somehow applying a favorable galvanic potential in order to get electroless plating to initiate on the surface. The present invention, however, provides a more economic and efficient way of achieving this result. In addition, the adhesion of the subsequent plate to the nickel-phosphorous surface is superior when the method of the present invention is utilized.

Therefore, in keeping with the teachings of the current invention, the intermediate nickel-phosphorous surface on the printed circuit board is treated, either by immersion or spray, with a solution of sulfuric acid, ammonium sulfate and water. Following this treatment, the surfaces are rinsed and then treated with the subsequent metal plating bath (usually electroless). Because of the treatment with the method of the present invention, the subsequent metal plating initiates on the nickel-phosphorous surface quickly and uniformly and continues until the desired thickness is achieved. Excellent coverage, uniformity and adhesion are achieved. Without the treatment of the current invention, the plating would not initiate, or in some cases, would initiate only sporadically, yielding poor coverage and adhesion.

An additional advantage of the current invention is that because the subsequent plate upon the nickel-phosphorous surface is so uniform, the solderability of that surface is significantly improved. This improved performance can be obtained even where activation of the surface is not absolutely necessary to initiate the subsequent plating.

The temperature and time required for activation of the nickel-phosphorous surface, pursuant to the teachings of this invention are not critical. Effective temperatures range from 70° to 200° F., but the treatment is most advantageously carried out at from 140° to 190° F. Treatment times can range from 0.5 to 10 minutes, but are most preferably from 3 to 7 minutes in immersion, and from 0.5 to 1 minute in spray or flood.

The concentration of the components may also vary widely and depend upon the desired contact time, temperature of operation, and method of contact. Typically, the sulfuric acid concentration may range from 1 to 300 gr/l, but is most preferably in the range of 20 to 30 gr/l. The ammonium sulfate concentration may range from 1 to 200 gr/l, but is most preferably in the range of 20 to 30 gr/l. The remainder of the solution is made up of water. Various other adjuvants may be added to the solution to enhance its performance. These adjuvants may be, without limitation, surfactants, wetting agents, defoamers, and other appropriate additives. Whatever adjuvants are used, they should be chosen such that they are compatible with the plating solution which follows.

It should also be understood that the solution of the invention can acceptably be formed in situ by the additions of ammonium ions and sulfate ions to an otherwise acidic solution. Thus, a solution of ammonium sulfate in phosphoric or citric acid would work similarly well for the purpose of this invention. The critical aspects of this invention are to have ammonium ions and sulfate ions together in an acidic solution. It is preferable to have ammonium ions present at concentrations of from 5 to 100 gr/l and sulfate ions present at concentrations from 5 to 300 gr/l in conjunction with a pH in range of 0 to 2.

The sequence of carrying out the method of the current invention may vary somewhat depending upon the particular application. As indicated previously, the current method is useful and appropriate as a pretreatment whenever a nickel-phosphorous surface is to be plated and is particularly useful when the subsequent plate is to be applied electrolessly. A typical process cycle for the current invention then is as follows:

1) Treat the nickel-phosphorous surface to be plated with the composition of the present invention.
2) Rinse the surface briefly in fresh water.
3) Apply the subsequent plating to the treated surface.

This invention is further describe in the following examples, which are given for illustrative purposes only, and are in no way limiting:

EXAMPLE I

A printed circuit board was plated with nickel-phosphorous utilizing an electroless nickel-phosphorous bath of the following composition:

| Component | Concentration (gr/l) |
|---|---|
| Nickel Sulfate | 25 gr/l |
| Sodium Hypophosphite | 30 gr/l |
| Citric Acid | 20 gr/l |
| Ammonium Hydroxide | to pH of 5.0 |

-continued

| Component | Concentration (gr/l) |
|---|---|
| Lead Nitrate | 2 ppm |

Temperature = 190° F.
Time = 3 hours

The board was then rinsed with water for one minute and immersed into an electroless palladium bath of the following composition:

| Component | Concentration (gr/l) |
|---|---|
| Palladium Chloride | 10 gr/l |
| Sodium Hydrophosphite | 10 gr/l |
| Ethylene Diamine | 20 gr/l |
| Hydrochloric Acid | to pH of 7.0 |
| Water | Balance |

Temperature = 160° F.
Time = 40 minutes

The palladium bath did not initiate plating quickly. After a relatively long period, some plating did initiate sporadically, but the initiation was sparse and the coverage and adhesion were very poor.

EXAMPLE II

A printed circuit board was treated in the same way as in Example I, except that the electroless palladium bath was substituted with an electroless copper bath of the following composition:

| Component | Concentration (gr/l) |
|---|---|
| Copper Sulfate | 5 gr/l |
| Ethylene Diamine Tetra Acetic Acid | 50 gr/l |
| Caustic | 9 gr/l |
| Formaldehyde | 4 gr/l |
| Water | Balance |
| Stabilizer | 20 ppm |

Temperature = 110° F.
Time = 20 minutes

The copper bath did not initiate plating even after an extended period.

EXAMPLE III

A printed circuit board was treated in the same way as in Example I except that before treatment in the electroless palladium bath, the board was treated with the following composition and then rinsed:

| Component | Concentration (gr/l) |
|---|---|
| Sulfuric Acid | 25 |
| Ammonium Sulfate | 25 |
| Water | Balance |

Temperature = 190° F.
Time = 5 minutes
Method of Application - Immersion

The board then initiated plating in the electroless palladium bath quickly, within one minute. The plate was uniform and the plating rate was high (20 microinches of palladium were plated in 20 minutes).

EXAMPLE IV

A printed circuit board was treated in the same way as in Example II, except that before treatment in the electroless copper bath, the board was treated with the following composition and then rinsed:

| Component | Concentration (gr/l) |
| --- | --- |
| Sulfuric Acid | 25 |
| Ammonium Sulfate | 25 |
| Water | Balance |

Temperature = 190° F.
Time = 5 minutes
Method of application - Immersion

The board then initiated plating in the electroless copper bath quickly, within one minute. The plate was uniform and the plating rate was high (20 microinches of copper in 20 minutes).

EXAMPLE V

A printed circuit board was tested in the same way as in Example III, except that the nickel-phosphorous surface was aged one month before it was treated with the method of this invention. The results of the subsequent electroless palladium plating were essentially the same, with excellent performance, coverage and plating rate.

EXAMPLE VI

Two printed circuit boards were treated for solderability. One board was processed in the same way as given in Example I. The second board was processed in the same way as Example III. The board treated as in Example I showed unacceptable solder, while boards prepared as in Example III soldered perfectly.

What is claimed is:

1. A method for activating a nickel-phosphorous alloy surface to accept subsequent plating comprising:
   (a) Contacting the surface with a composition consisting essentially of a mixture of ammonium ions and sulfate ions in an aqueous acidic media;
   (b) Subsequently plating over the surface.

2. A method according to claim 1, wherein the composition comprises a mixture of sulfuric acid and ammonium sulfate.

3. A method according to claim 2, wherein the plating occurs by electroless means.

4. A method according to claim 3, wherein the plating is selected from the group consisting of electroless copper, electroless palladium, electroless gold, and electroless cobalt.

5. A method according to claim 4, wherein the solderability of the subsequently plated surface is enhanced.

6. A method according to claim 4, wherein the nickel-phosphorous surface has been oxidized prior to contacting the surface with the composition.

7. A method according to claim 4, wherein the adhesion, uniformity or coverage of the subsequent plate is improved.

8. A method according to claim 4, wherein the concentration of the sulfuric acid is from 1 to 300 grams per liter, and the concentration of ammonium sulfate is from 1 to 200 grams per liter.

9. A method according to claim 3, wherein the solderability of the subsequently plated surface is enhanced.

10. A method according to claim 3, wherein the nickel-phosphorous alloy surface has been oxidized prior to contacting the surface with the composition.

11. A method according to claim 3, wherein the adhesion, uniformity or coverage of the subsequent plate is improved.

12. A method according to claim 3, wherein the concentration of the sulfuric acid is from 1 to 300 grams per liter, and the concentration of ammonium sulfate is from 1 to 200 grams per liter.

13. A method according to claim 2, wherein the solderability of the subsequently plated surface is enhanced.

14. A method according to claim 2, wherein the nickel-phosphorous alloy surface has been oxidized prior to contacting the surface with composition.

15. A method according to claim 2, wherein the adhesion, uniformity, or coverage of the subsequent plate is improved.

16. A method according to claim 2, wherein the concentration of the sulfuric acid is from 1 to 300 grams per liter, and the concentration of ammonium sulfate is from 1 to 200 grams per liter.

* * * * *